(12) United States Patent
Naser-Ghodsi et al.

(10) Patent No.: US 8,052,885 B2
(45) Date of Patent: Nov. 8, 2011

(54) STRUCTURAL MODIFICATION USING ELECTRON BEAM ACTIVATED CHEMICAL ETCH

(75) Inventors: Mehran Naser-Ghodsi, Hamilton, MA (US); Garrett Pickard, Mountain View, CA (US); Rudy F. Garcia, Union City, CA (US); Ming Lun Yu, Fremont, CA (US); Kenneth Krzeczowski, Scotts Valley, CA (US); Matthew Lent, Livermore, CA (US); Sergey Lopatin, Morgan Hill, CA (US); Chris Huang, Cupertino, CA (US); Niles K. MacDonald, San Jose, CA (US)

(73) Assignee: KLA-Tencor Corporation, San Jose, CA (US)

( * ) Notice: Subject to any disclaimer, the term of this patent is extended or adjusted under 35 U.S.C. 154(b) by 1174 days.

(21) Appl. No.: 11/622,625

(22) Filed: Jan. 12, 2007

(65) Prior Publication Data

US 2007/0158303 A1 Jul. 12, 2007

Related U.S. Application Data

(60) Provisional application No. 60/758,818, filed on Jan. 12, 2006, provisional application No. 60/829,643, filed on Oct. 16, 2006, provisional application No. 60/829,636, filed on Oct. 16, 2006, provisional application No. 60/829,659, filed on Oct. 16, 2006.

(51) Int. Cl.
*B44C 1/22* (2006.01)
*C03C 15/00* (2006.01)
*C03C 25/68* (2006.01)
*C23F 1/00* (2006.01)
*H01L 21/302* (2006.01)
*H01L 21/461* (2006.01)

(52) U.S. Cl. .......................................... 216/58; 438/706
(58) Field of Classification Search .................. None
See application file for complete search history.

(56) References Cited

U.S. PATENT DOCUMENTS 4,315,782 A 2/1982 Tarng
(Continued)

FOREIGN PATENT DOCUMENTS

JP 40115539 A 4/1989

OTHER PUBLICATIONS

Asakawa et al. Chlorine Based Dry Etching og III/V Compound Semiconductors for Optoelectronic Application, Nov. 18, 1997, Japanese Journal of Applied Physics, vol. 37, pp. 373-387.*

(Continued)

*Primary Examiner* — Nadine G Norton
*Assistant Examiner* — Stephanie Duclair
(74) *Attorney, Agent, or Firm* — Joshua D. Isenberg; JDI Patent (57) ABSTRACT

Structural modification using electron beam activated chemical etch (EBACE) is disclosed. A target or portion thereof may be exposed to a gas composition of a type that etches the target when the gas composition and/or target are exposed to an electron beam. By directing an electron beam toward the target in the vicinity of the gas composition, an interaction between the electron beam and the gas composition etches a portion of the target exposed to both the gas composition and the electron beam. Structural modifications of the target may be conducted by means of etching due to interaction between the electron beam and gas composition.

18 Claims, 9 Drawing Sheets

U.S. PATENT DOCUMENTS

| | | | | |
|---|---|---|---|---|
| 4,622,095 | A * | 11/1986 | Grobman et al. | 216/65 |
| 4,897,552 | A * | 1/1990 | Okunuki et al. | 250/492.2 |
| 4,966,885 | A | 10/1990 | Hebard | |
| 4,994,140 | A | 2/1991 | Kenzo et al. | |
| 5,188,706 | A | 2/1993 | Hori et al. | 216/12 |
| 5,346,841 | A | 9/1994 | Yajima | |
| 5,502,306 | A | 3/1996 | Meisburger et al. | |
| 5,686,171 | A | 11/1997 | Vokoun et al. | 428/209 |
| 5,734,164 | A | 3/1998 | Sanford | |
| 5,736,002 | A | 4/1998 | Allen et al. | |
| 6,027,842 | A * | 2/2000 | Ausschnitt et al. | 430/30 |
| 6,133,147 | A | 10/2000 | Rhee et al. | |
| 6,593,171 | B2 | 7/2003 | Farnworth | |
| 6,673,637 | B2 | 1/2004 | Wack et al. | |
| 6,753,538 | B2 | 6/2004 | Musil et al. | 250/492.2 |
| 6,771,806 | B1 | 8/2004 | Satya et al. | |
| 6,787,783 | B2 | 9/2004 | Marchman et al. | |
| 6,801,596 | B2 | 10/2004 | Nasser-Ghodsi et al. | |
| 6,843,927 | B2 | 1/2005 | Nasser-Ghodsi | 216/84 |
| 6,943,350 | B2 | 9/2005 | Nasser-Ghodsi et al. | 250/310 |
| 7,148,073 | B1 | 12/2006 | Soltz et al. | |
| 7,312,448 | B2 | 12/2007 | Principe | |
| 7,348,556 | B2 | 3/2008 | Chitturi et al. | |
| 2002/0048913 | A1 | 4/2002 | Finney | |
| 2003/0047691 | A1 | 3/2003 | Musil et al. | |
| 2004/0013858 | A1 | 1/2004 | Hacker et al. | 428/195.1 |
| 2004/0033425 | A1 | 2/2004 | Koops et al. | |
| 2004/0041095 | A1 * | 3/2004 | Nasser-Ghodsi et al. | 250/310 |
| 2004/0266200 | A1 | 12/2004 | Schaller et al. | 438/705 |
| 2005/0048751 | A1 | 3/2005 | Moore | |
| 2006/0000802 | A1 | 1/2006 | Kumar et al. | 216/67 |
| 2007/0069759 | A1 | 3/2007 | Rzepiela et al. | |
| 2007/0158303 | A1 | 7/2007 | Nasser-Ghodsi et al. | 430/5 |
| 2007/0158304 | A1 | 7/2007 | Nasser-Ghodsi et al. | 216/66 |
| 2007/0158562 | A1 | 7/2007 | Nasser-Ghodsi et al. | 250/310 |
| 2008/0088831 | A1 | 4/2008 | Mulders et al. | |

OTHER PUBLICATIONS

Kowalksi, Ion bombardment modificaiton of surface morphology of solids, 1994, Journal of Materials Science, vol. 29, pp. 3542-3552.*

Matsui et al, Electron Beam induced Selective Etching and Deposition Technology, 1989, Journal of Vacuum Science and Technology, Sep./Oct. 1182-1190.*

Wang et al, Etching Characteristics fo Chromium Thin Films by an Electron Beam Induced Surface Reasction, 2003, Semiconductor Science and Technology, vol. 18, 199-205.*

Toyoda et al, Ultra Smooth Surface Preparation using Gas Cluster Ion Beams, 2002, Japanese Journal of Applied Physics, vol. 41, pp. 42874290.*

U.S. Appl. No. 60/758,818 entitled "Tungsten Plug Deposition Quality Evaluation Method by EBACE Tecnology" to Yehiel Gotkis, filed Jan. 12, 2006.

U.S. Appl. No. 60/829,636 entitled "Etch Selectivity Enhancement in Electron Beam Activated Chemical Etch" to Nasser-Ghodsi; Mehran; et al., filed Oct. 16, 2006.

U.S. Appl. No. 60/829,643 entitled "Structural Modification Using Electron Beam Activated Chemical Etch" to Nasser-Ghodsi; Mehran; et al., filed Oct. 16, 2006.

U.S. Appl. No. 60/829,659 entitled "Three-Dimensional Imagine Using Electron Beam Activated Chemical Etch" to Nasser-Ghodsi; Mehran; et al., filed Oct. 16, 2006.

U.S. Appl. No. 11/622,793 entitled "Tungsten Plug Deposition Quality Evaluation Method by EBACE Technology" to Yehiel Gotkis, filed Jan. 12, 2007.

International Search Report and Written Opinion for International Application No. PCT/US07/60503.

A. Jain et al., "Thin Solid Films" vol. 269, pp. 51-56, 1995.

Office Action dated Feb. 19, 2009 for U.S. Appl. No. 11/622,758.

Final Office Action dated Aug. 14, 2009 for U.S. Appl. No. 11/622,758.

"Central processing unit" Encyclopedia Britannica, 2009. Encyclopedia Britannica Online, Aug. 10, 2009 <http://www.search.eb.com/eb/article-9022087>.

Notice of Allowance and Fee(s) dated Dec. 17, 2009 for U.S. Appl. No. 11/622,758.

Office Action dated Dec. 24, 2009 for U.S. Appl. No. 11/622,605.

Office Action dated Mar. 29, 2010 for U.S. Appl. No. 11/622,793.

Final Office Action dated Jun. 4, 2010 issued for U.S. Appl. No. 11/622,605.

Final Office Action dated Jul. 1, 2010 issued for U.S. Appl. No. 11/622,793.

PSII, An Introduction to Plasma Source Ion Implantation, University of Wisconsin Center for Plasma Aided Manufacturing, Oct. 30, 2005.

Office Action dated Apr. 13, 2010 issued for U.S. Appl. No. 11/752,829.

Notice of Allowance dated Jan. 13, 2001 issued for U.S. Appl. No. 11/622,793.

Office Action dated Sep. 13, 2010 issued for U.S. Appl. No. 11/622,793.

Office Action dated Sep. 13, 2010 issued for U.S. Appl. No. 11/752,829.

Notice of Allowance dated Sep. 17, 2010 issued for U.S. Appl. No. 11/622,605.

* cited by examiner

202 — EXPOSE TARGET OR PORTION THEREOF TO GAS COMPOSITION

204 — DIRECT ELECTRON BEAM TOWARD TARGET IN VICINITY OF GAS COMPOSITION TO ETCH A PORTION OF THE TARGET EXPOSED TO THE GAS COMPOSITION AND ELECTRON BEAM

206 — STRUCTURAL MODIFICATION OF TARGET BY MEANS OF ITS ETCHING DUE TO INTERACTION BETWEEN ELECTRON BEAM AND GAS COMPOSITION

STRUCTURAL MODIFICATION USING ELECTRON BEAM ACTIVATED CHEMICAL ETCH

CLAIM OF PRIORITY

This application claims the benefit of priority of co-pending U.S. provisional application No. 60/758,818 entitled to Yehiel Gotkis, Sergey Lopatin and Mehran Nasser-Ghodsi filed Jan. 12, 2006 and entitled, "TUNGSTEN PLUG DEPOSITION QUALITY EVALUATION METHOD BY EBACE TECHNOLOGY", the entire disclosures of which are incorporated herein by reference.

This application claims the benefit of priority of co-pending U.S. provisional application No. 60/829,643 to Mehran Nasser-Ghodsi et al filed Oct. 16, 2006 and entitled, "STRUCTURAL MODIFICATION USING ELECTRON BEAM ACTIVATED CHEMICAL ETCH", the entire disclosures of which are incorporated herein by reference.

This application claims the benefit of priority of co-pending U.S. provisional application No. 60/829,636 to Mehran Nasser-Ghodsi et al filed Oct. 16, 2006 and entitled, "ETCH SELECTIVITY ENHANCEMENT IN ELECTRON BEAM ACTIVATED CHEMICAL ETCH", the entire disclosures of which are incorporated herein by reference.

This application claims the benefit of priority of co-pending U.S. provisional application No. 60/829,659 to Mehran Nasser-Ghodsi et al filed Oct. 16, 2006 and entitled, "THREE-DIMENSIONAL IMAGING USING ELECTRON BEAM ACTIVATED CHEMICAL ETCH", the entire disclosures of which are incorporated herein by reference.

CROSS REFERENCE TO RELATED APPLICATIONS

This application is related to co-pending U.S. application Ser. No. 11/622,793 to Yehiel Gotkis, Sergey Lopatin and Mehran Nasser-Ghodsi filed Jan. 12, 2006 and entitled, "TUNGSTEN PLUG DEPOSITION QUALITY EVALUATION METHOD BY EBACE TECHNOLOGY", the entire disclosures of which are incorporated herein by reference.

This application is also related to co-pending U.S. patent application Ser. No. 11/622,605 to Mehran Nasser-Ghodsi et al filed the same day as the present application and entitled, "ETCH SELECTIVITY ENHANCEMENT IN ELECTRON BEAM ACTIVATED CHEMICAL ETCH", the entire disclosures of which are incorporated herein by reference.

This application is also related to co-pending U.S. patent application Ser. No. 11/622,758 to Mehran Nasser-Ghodsi et al filed the same day as the present application and entitled, "THREE-DIMENSIONAL IMAGING USING ELECTRON BEAM ACTIVATED CHEMICAL ETCH", the entire disclosures of which are incorporated herein by reference.

FIELD OF THE INVENTION

This invention generally relates to semiconductor fabrication and more particularly to electron beam activated chemical etching (eBACE).

BACKGROUND OF THE INVENTION

A technique known as electron beam activated chemical etch (EBACE) has been developed as an analytical tool in semiconductor fabrication. In this technique an etchant, typically in the form of a gas or vapor, is introduced into the field of view of a scanning electron microscope proximate the surface of a target, such as an integrated circuit device. The etchant is usually one that is known to etch the target material upon electron-beam induced activation. The electron beam from the electron microscope activates the etchant resulting in structural modifications of the target surface by means of etching in locations exposed to both the etchant and the electron beam. The resulting localized structural modifications of the target surface can be combined with real time imaging of the surface as it is etched.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
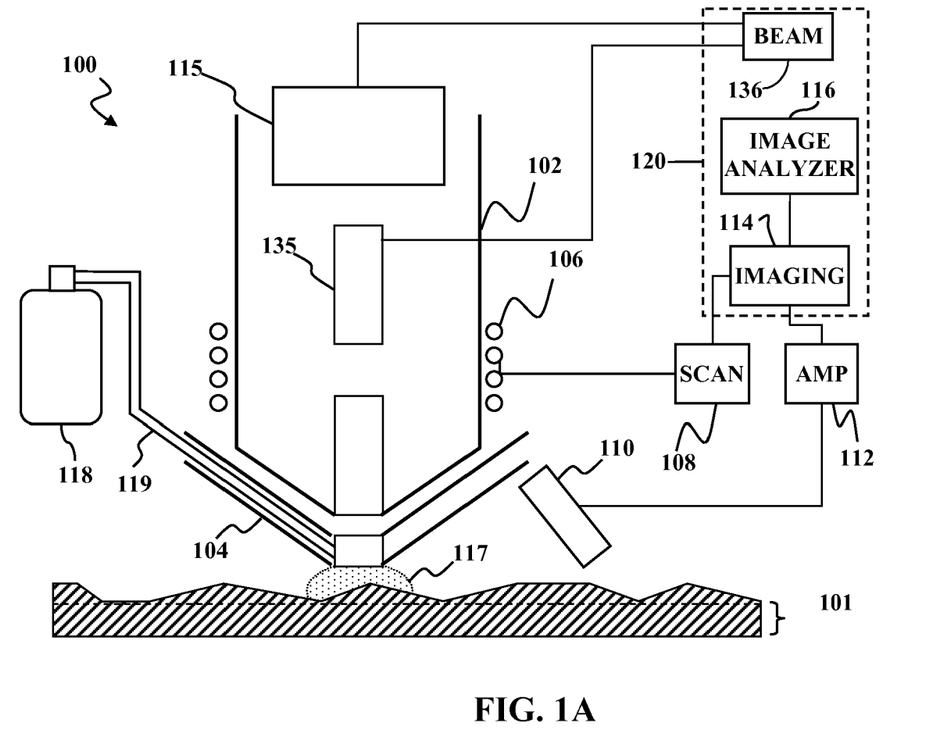
FIG. 1A is a schematic diagram of an electron beam activated chemical etch (EBACE) system adapted for structural modification according to an embodiment of the present invention.
Figure 1B:
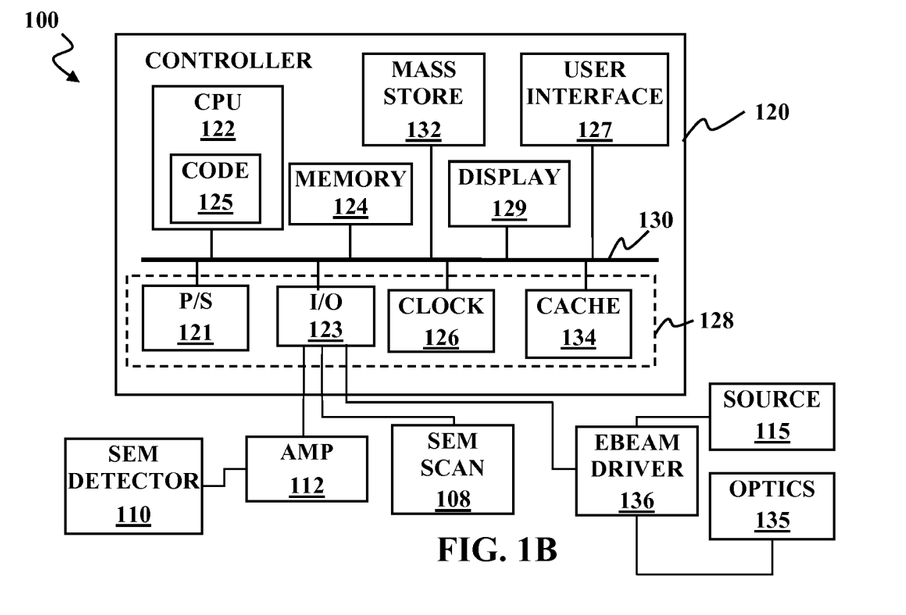
FIG. 1B is a block diagram of the system of FIG. 1A.

FIGS. 1A-1B illustrate an example of an electron beam activated chemical etch (EBACE) system 100 adapted for use with embodiments of the present invention. As shown in FIG. 1A, the system 100 generally includes a scanning electron microscope having an electron beam column 102 with an electron source 115, beam optics 135 an immersion lens 104. The electron beam column 102 may be controlled by electronics 136, referred to herein as an e-beam driver. The e-beam driver 136 may control the electron source 115, beam optics 135 and immersion lens 104.

Electrons from the electron beam column 102 are focused onto a target surface 101, which may be an integrated circuit wafer or a test wafer. The electrons are scanned across the surface of the target 101 by magnet deflecting fields provided by one or more scanning coils 106. Current is provided to the coils 106 via a scanner driver 108. Electrons striking the target 101 are either backscattered or initiate secondary emission. Either way a detector 110 generates a signal proportional to the amount of backscattering or secondary emission. The signal may be amplified by an amplifier 112. The amplified signal and a signal from the scanner driver 108 are combined by an image generator 114 to produce a high-contrast, magnified image of the surface of the target 101. The images are analyzed by an image analyzer 116.

The target 101 may optionally have a rough surface, which may be required to be smoothed or modified according to the embodiments of the present invention.

An electron activated etching gas or vapor composition 117 is introduced from one or more remote sources 118 via a conduit 119. It is desirable to introduce the etching gas or vapor as close as possible to the point on the surface of the target 101 impacted by the electrons from the electron beam column 102. By way of example, the etching gas or vapor may be introduced between two adjacent electrodes of the immersion lens 104. The electrons activate localized etching of the target surface 101. Images of the etched surface generated by the image analyzer may be analyzed by the image analyzer 116. The image analysis determines a measure of quality of the modified surface or shape and size of resulting formed structures.

As shown in the block diagram of FIG. 1B, the image generator 114 and image analyzer may be part of a controller 120. The controller 120 may be a self-contained microcontroller. Alternatively, the controller 120 may be a general purpose computer configured to include a central processor unit (CPU) 122, memory 124 (e.g., RAM, DRAM, ROM, and the like) and well-known support circuits 128 such as power supplies 121, input/output (I/O) functions 123, clock 126, cache 134, and the like, coupled to a control system bus 130. The memory 124 may contain instructions that the CPU 122 executes to facilitate the performance of the system 100. The instructions in the memory 124 may be in the form of the program code 125. The code 125 may control, e.g., the electron beam voltage and current produced by the source 115, the focusing of the beam with the beam optics 135 and the immersion lens 104 and the scanning of the electron beam by the coils 106 and the formation of images with the signal from the detector 110 in a conventional fashion. The code 125 may also implement analysis of the images.

The code 125 may conform to any one of a number of different programming languages such as Assembly, C++, JAVA or a number of other languages. The controller 120 may also include an optional mass storage device, 132, e.g., CD-ROM hard disk and/or removable storage, flash memory, and the like, which may be coupled to the control system bus 130. The controller 120 may optionally include a user interface 127, such as a keyboard, mouse, or light pen, coupled to the CPU 122 to provide for the receipt of inputs from an operator (not shown). The controller 120 may also optionally include a display unit 129 to provide information to the operator in the form of graphical displays and/or alphanumeric characters under control of the processor unit 122. The display unit 129 may be, e.g., a cathode ray tube (CRT) or flat screen monitor.

The controller 120 may exchange signals with the imaging device scanner driver 108, the e-beam driver 135 and the detector 110 or amplifier 112 through the I/O functions 123 in response to data and program code instructions stored and retrieved by the memory 124. Depending on the configuration or selection of controller 120 the scanner driver 108 and detector 110 or amplifier 112 may interface with the I/O functions via conditioning circuits. The conditioning circuits may be implemented in hardware or software form, e.g., within code 125.

Figure 2:
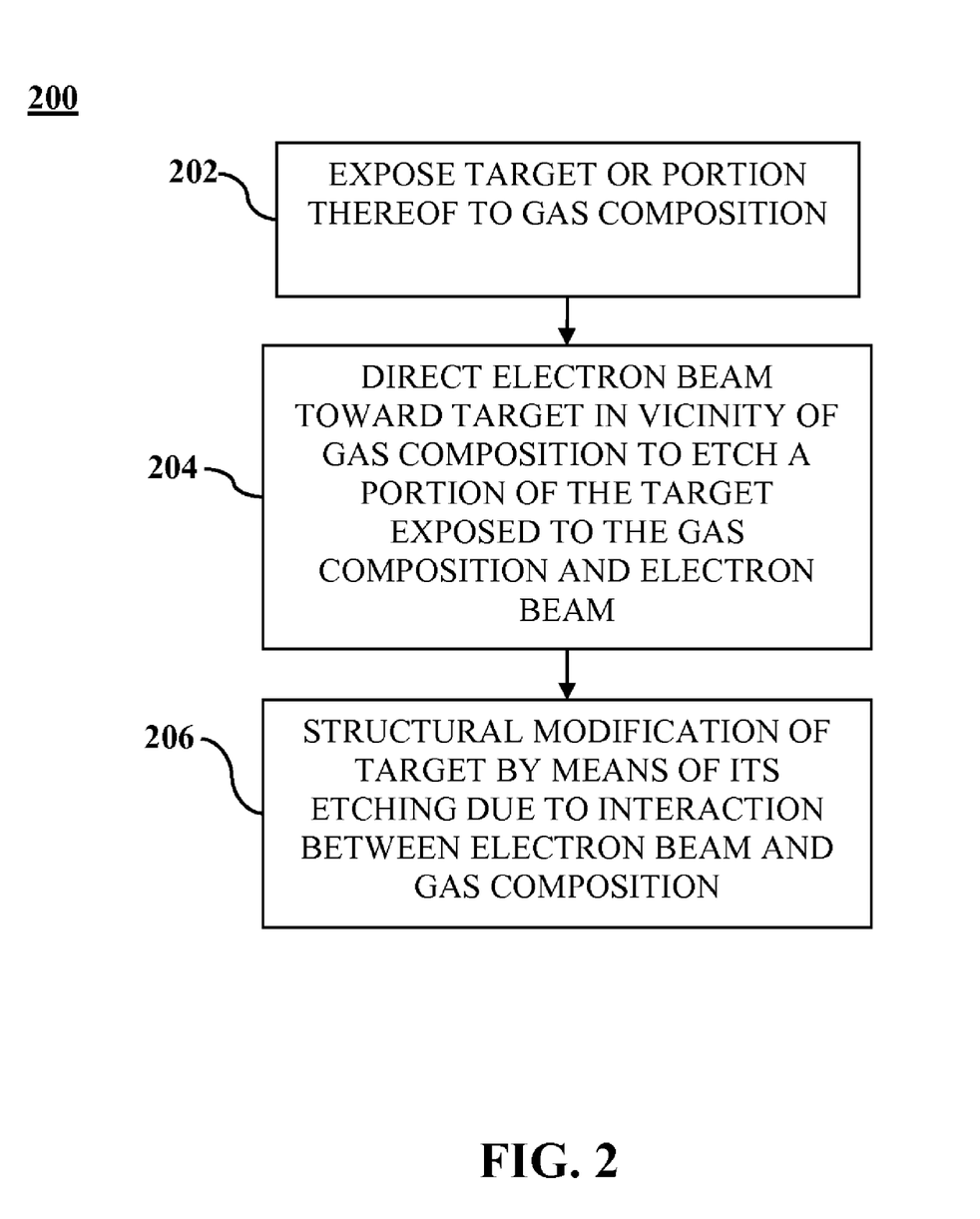
FIG. 2 is a flow diagram illustrating an example of a method for structural modification using eBACE according to an embodiment of the present invention.

FIG. 2 illustrates a method 200 for structural modification using electron beam activated chemical etch (EBACE). At 202 the target 101 or a portion thereof is exposed to the gas composition 117. The gas composition is of a type that etches nearby portions of the target 101 when the gas composition 117 is exposed to the electron beam. At 204 the electron beam is directed toward the target 101 in the vicinity of the gas composition 117. An interaction between the electron beam and the gas composition 117 etches a portion of the target 101 exposed to both the gas composition 117 and the electron beam. At 206 a target is structurally modified due to interaction between the electron beam and gas composition 117.

Figure 3A:
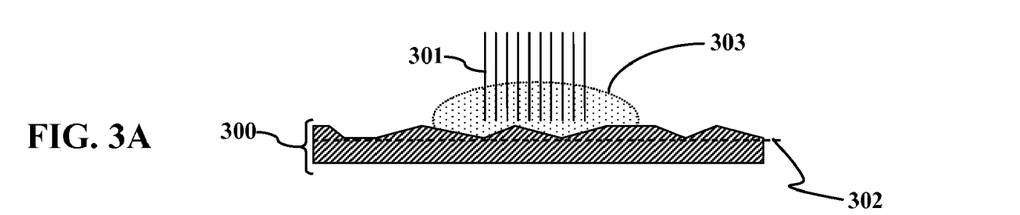
FIGS. 3A-3B are cross-sectional schematic diagrams illustrating structural modification using eBACE according to an embodiment of the present invention.
Figure 3B:
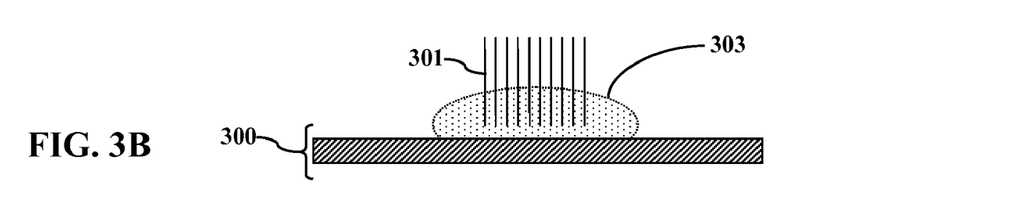

There are a number of different techniques for structural modifications according to embodiments of the present invention. For example, as illustrated in FIGS. 3A-3B, a target 300 may have a rough surface, which is exposed to an electron beam 301 and gas composition 303. A gas composition 303 is chosen such that target can be etched to substantial depth at chosen level 302 due to interaction between the electron beam 301 and gas composition 303. By way of example, the material of a target 300 may be silicon and gas composition 303 may include a carbon-containing organic compound, an etchant and oxygen.

Figure 4A:
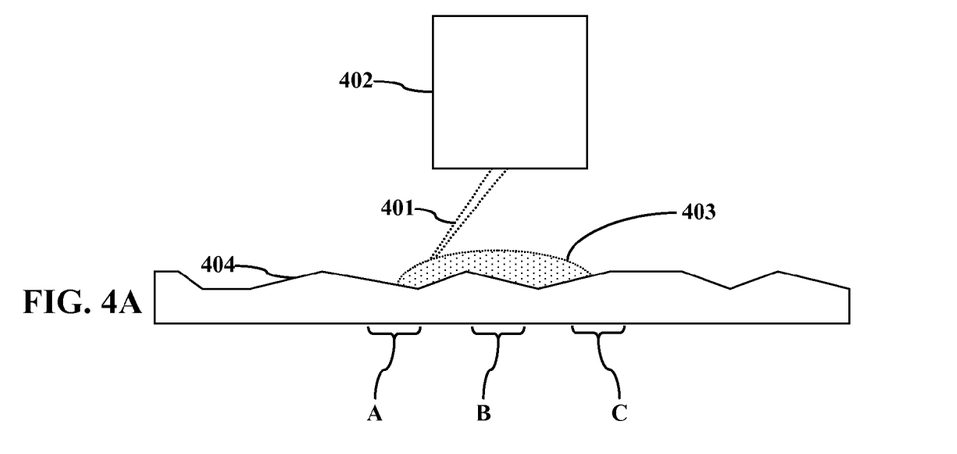
FIGS. 4A-4D are cross-sectional schematic diagrams illustrating optical component formation by means of variation of an electron beam scanning pattern during eBACE according to another alternative embodiment of the present invention.
Figure 4B:
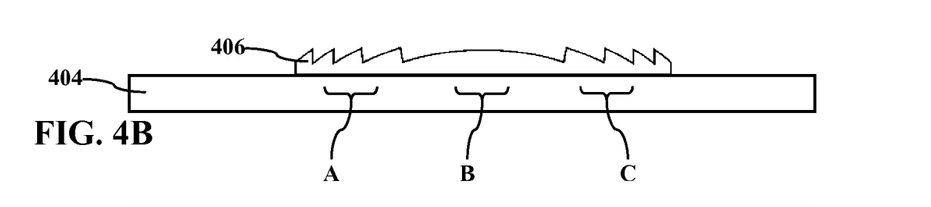
Figure 4C:
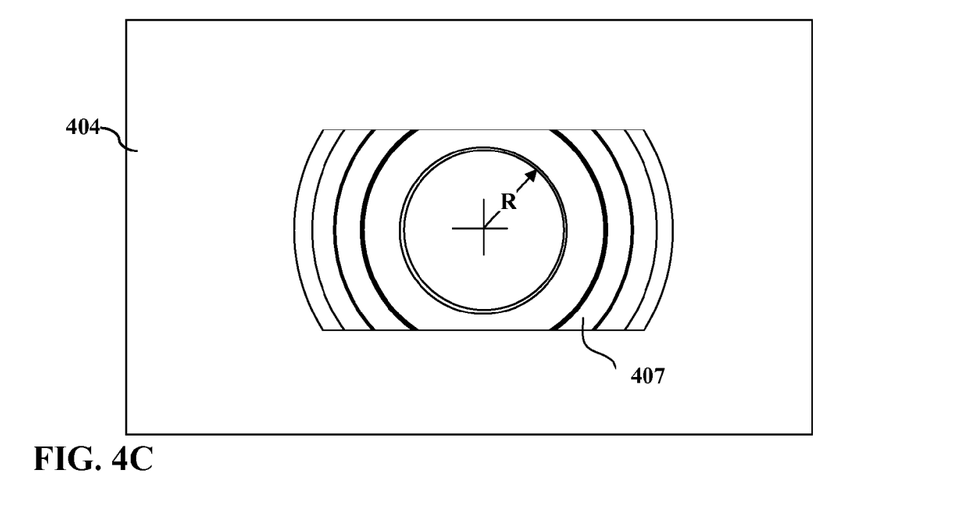

In other embodiments of the invention the modification of optical components may be conducted by adjusting an electron beam energy, an electron beam current or a scanning pattern of the electron beam from the electron beam column 102. As the way of example, FIGS. 4A-4D illustrate the formation of a known Fresnel lens. As shown in FIG. 4A the scanning pattern of the electron beam 401 from a beam column 402 may be adjusted by varying a dwell time or a repetition rate of the electron beam 401 for different regions A, B, C of a target 404. By way of example, the dwell time may be larger for deeper etching and may be shorter for shallower etching in order to create structures with different spatial features. Consequently, interaction between the electron beam an electron-beam activated gas composition 403 and the target 404 results in different depth of etching of regions A, B and C as shown in FIG. 4B. The dwell time and/or repetition rate of the electron beam may be controlled, e.g., through appropriate configuration of the code 125 running on the controller 120. As shown in FIG. 4C, the scanning pattern may be varied in such a way as to etch two dimensional pattern 407 in regions A, B and C to different depths.

To generate annular structures, such as those shown in FIG. 4C, the target 404 may be rotated about an appropriate center of curvature during exposure to the electron beam 401. The dwell time and/or electron current for the electron beam may be varied as functions of radius R to account for variation in path length with respect to radius. For example, if etching to a uniform depth is desired, e.g., to form a flat-bottomed annular trench, dwell time and/or current may increase as radius increases in order to keep the overall electron dose substantially constant as a function of radius. Alternatively, the dose may be adjusted in a way that produces a desired etch profile.

For example, if dwell time and electron beam current are kept constant as radius increases, the dose will be higher and the amount of etching greater for lower radius portions of the dose pattern. If it is desired to increase etching with radius, e.g., to produce a convex structure, the dose and/or dwell time may increase with radius to produce the desired structure.

It is noted that if the contribution of the gas composition 403 to etching of the target 404 by the electron beam 401 does not vary significantly, the etching may be very finely controlled through precise control of the electron beam 401. To keep the contribution of the gas composition 403 to the etching from varying significantly the scanning pattern of the electron beam 401 may be adjusted for different regions of the target 404, e.g., by varying dwell time and/or repetition rate without varying the gas composition 403. As used herein varying the gas composition 403 may include, but is not limited to varying stoichiometric ratios and/or flow rates, etc for gases making up the gas composition 403.

Figure 4D:
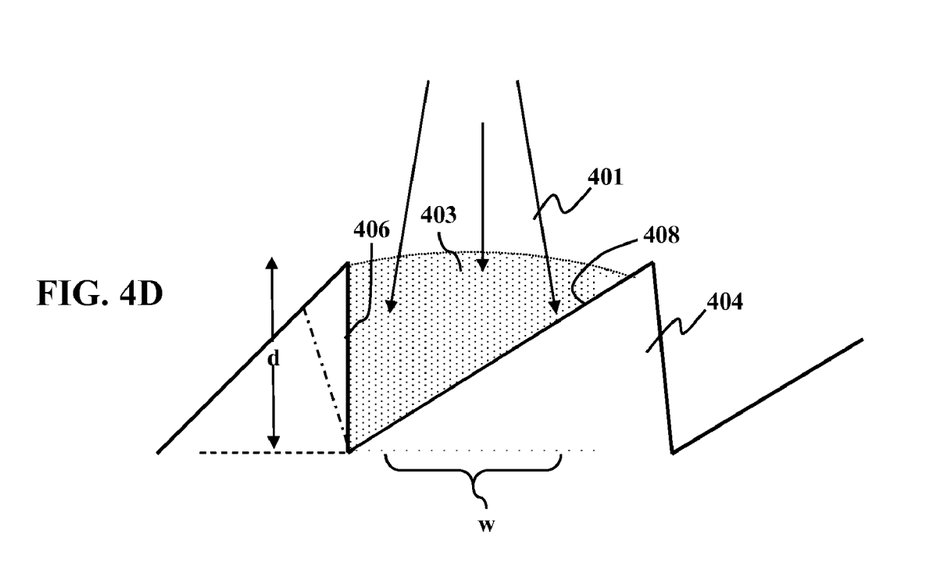

As shown in FIG. 4D, the scanning pattern of the electron beam 401 may vary as a function of depth. For example, etching the target 404 to a sufficient depth may form a feature having one or more sidewalls 406, 408 of specific shape or angle. If the scanning pattern remains more or less unchanged as a function of depth, the etching of the target 404 tends to attack the sidewall 406 resulting in uncontrolled slanted sidewall, as indicated by the dashed-dotted line. To avoid this effect the scanning pattern of the electron beam 401 may be varied as a function of etch depth d to produce a sidewall of specific shape (i.e., a sidewall that is substantially perpendicular or has a definite angle to a plane of the target 404). By way of example, a width w of the scanning pattern may be varied as a function of depth of etching of the target 404. The scan width w may be defined as a range of excursion of the electron beam 401 along a direction parallel to a plane of the target. For example, if the target plane is more or less horizontal, the scan width w may be a horizontal range of excursion of the electron beam 401. The horizontal range of excursion of the electron beam 401 may be adjusted, e.g., through appropriate control of the scanner 106 with the scanner driver 108. To fabricate the sidewall 406 such that it is substantially vertical or has definite angle, the scanning pattern of the electron beam 401 may be varied as a function of time such that the scan width w narrows as a feature is etched more deeply into the target 404. Finally, as may be seen from FIGS. 4A-4D, the combination of parametrical and spatial control of the electron beam may result in three dimensional optical component formation, for example a Fresnel lens.

Figure 5:
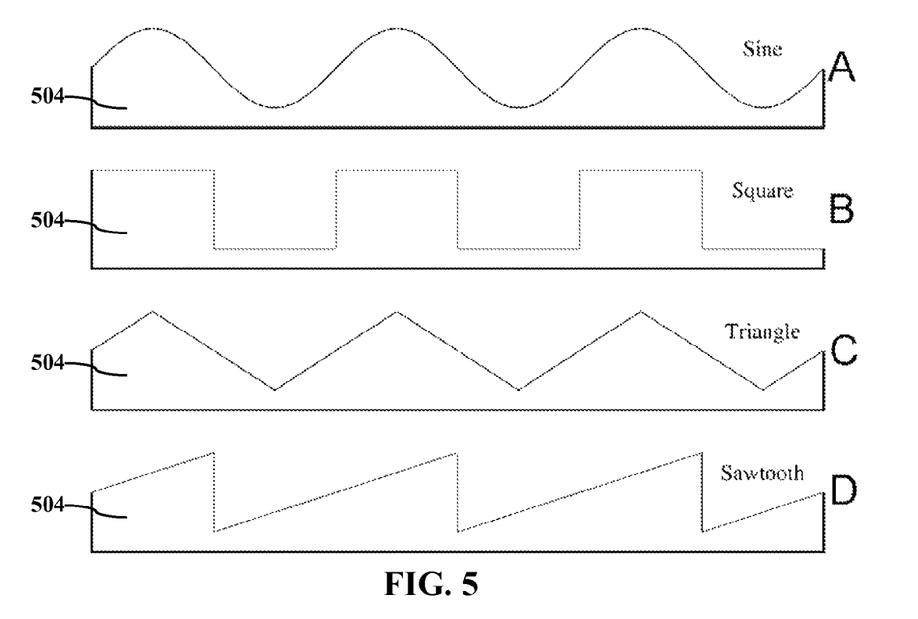
FIGS. 5A-5D are schematic cross-sectional side views illustrating diffractive optical components formation by means of variation of an electron beam scanning pattern during eBACE according to another alternative embodiment of the present invention.
Figure 6:
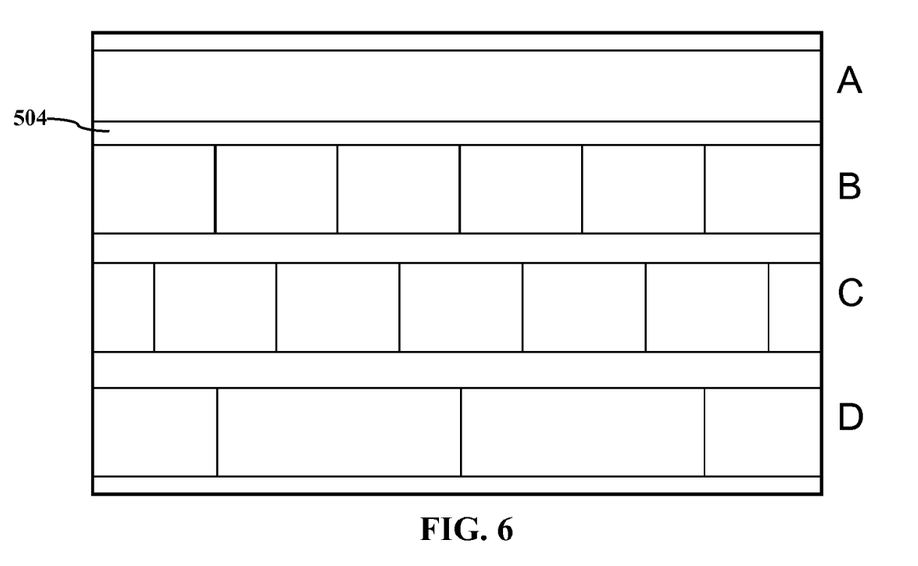
FIGS. 6A-6D are top views of diffractive optical components shown on FIGS. 5A-5D respectively.

Another example of structural modification using scanning pattern of the electron beam varied as a function of depth shown on FIG. 4A is to fabricate diffractive optical structures such as gratings as shown on cross-sections in FIG. 5 and on top views in FIG. 6. Such structures can be formed on a wafer 504 with the described above technique followed by trimming the devices to required length and width. Due to the advantages of disclosed eBACE method, i.e. precise parametrical and spatial control of the electron beam, those structures can be fabricated of various shapes: sine (FIG. 5 part A and FIG. 6 part A), square (FIG. 5 part B and FIG. 6 part B), triangle (FIG. 5 part C and FIG. 6 part C), sawtooth (FIG. 5 part D and FIG. 6 part D) or otherwise.

Figure 7A:
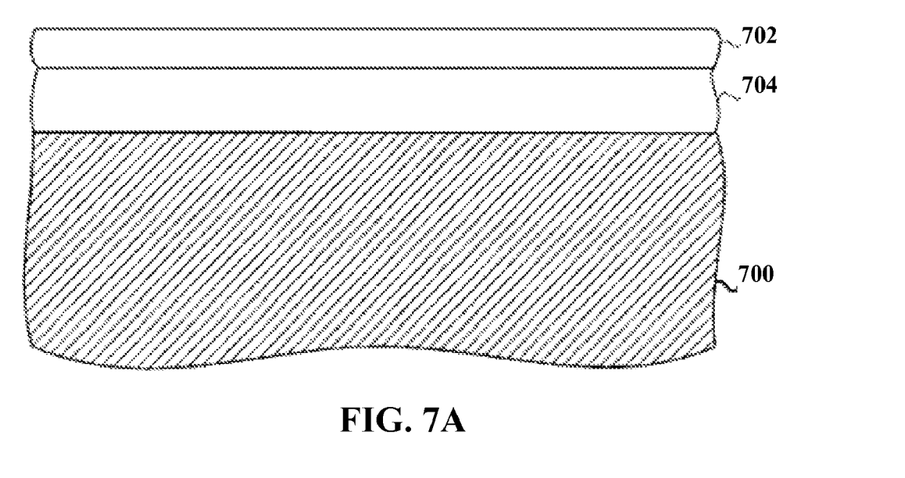
FIGS. 7A-7C are schematic cross-sectional side views illustrating fin FET device formation by means of selective etching/deposition using eBACE method according to another alternative embodiment of the present invention.
Figure 7B:
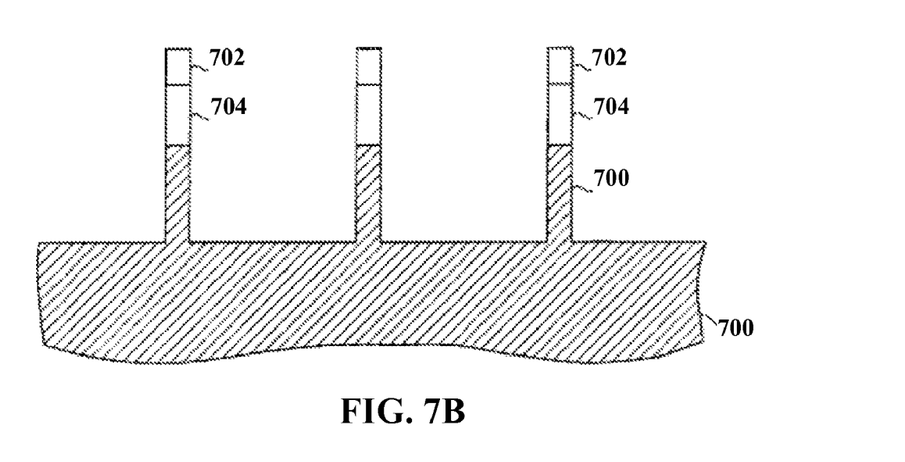
Figure 7C:
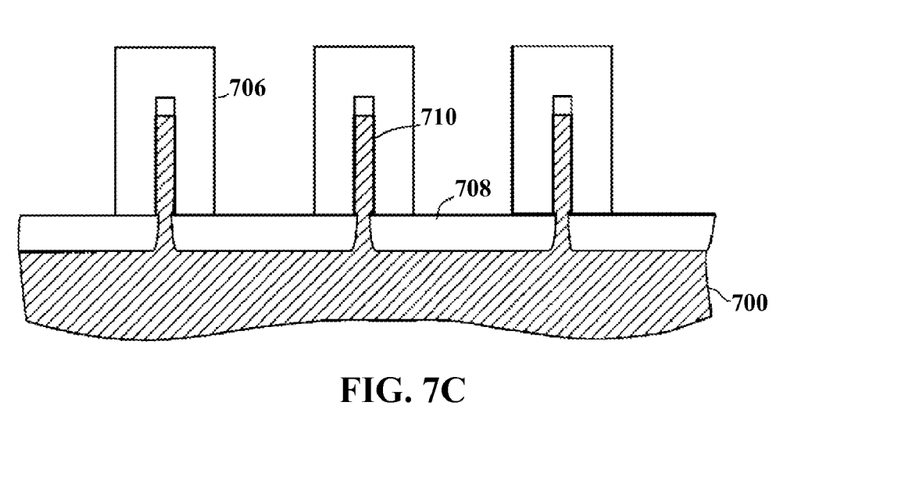

Disclosed eBACE structural modification method can be applied to fabricate devices such as fin FETs, overcoming many disadvantages of the prior art and specifically of known method of Focused Ion Beams (FIB). Thus the system shown on FIG. 1 and eBACE method of precise structural modifications illustrated on FIG. 5 and FIG. 6 provide the ability to form fin FET devices from bulk wafers by means of selective etching/deposition as shown in FIGS. 7A-7C as cross-sectional side views of semiconductor structures. Specifically, an exemplary bulk wafer 700 with a hardmask blocking layer 704 and hardmask cap layer 702 is shown on FIG. 7A. The wafer portion and both covering hardmask layers can be selectively patterned and etched to form fin structure as shown on FIG. 7B. Consequently, wafer portions between fins and sidewalls of the fins are covered with isolation layer by means of oxidation process. Since the oxide layer is much thicker on the etched substrate between the fins than on the fin's sidewalls after removing unwanted oxide with thickness equal to sidewall's layer some oxide isolation may remain on the substrate between the fins. The thickness of the oxide layer may be controller with eBACE or, alternatively, using FIB. Finally a fin FET device can be completed by adding insulator layers 710 to each side of the fins and opposing end walls of the fins followed by gates formation 706 deposited over fins insulator and oxide layers 708 between fins as illustrated by FIG. 7C. The advantages of eBACE method over FIB are as following. Use of the eBACE method facilitates the formation of fin FET devices from bulk semiconductor wafers without changing impedances for structures thinner than 32 nm, which can happen when such devices are fabricated using FIB methods. Additionally, eBACE method does not implant ions while FIB method does. Finally, unlike FIB, the eBACE method does not tend to smear photoresist. Furthermore migration of ions can damage equipment.

Figure 8A:
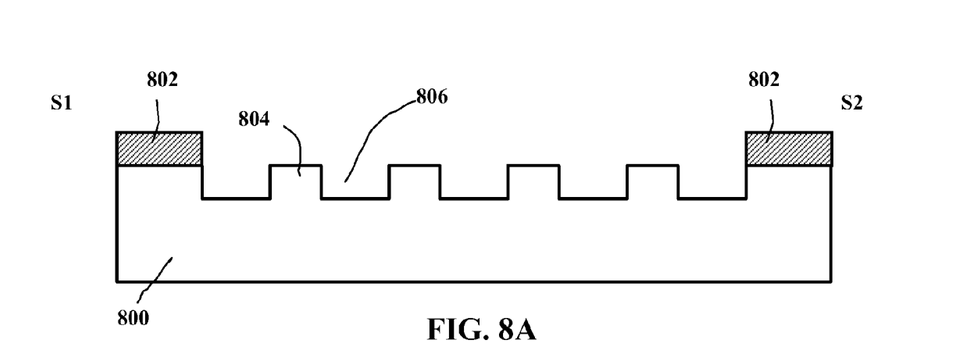
FIG. 8A-8B are schematic cross sectional and pattern top views of Alternating Phase-Shift Mask formation using eBACE method.
Figure 8B:
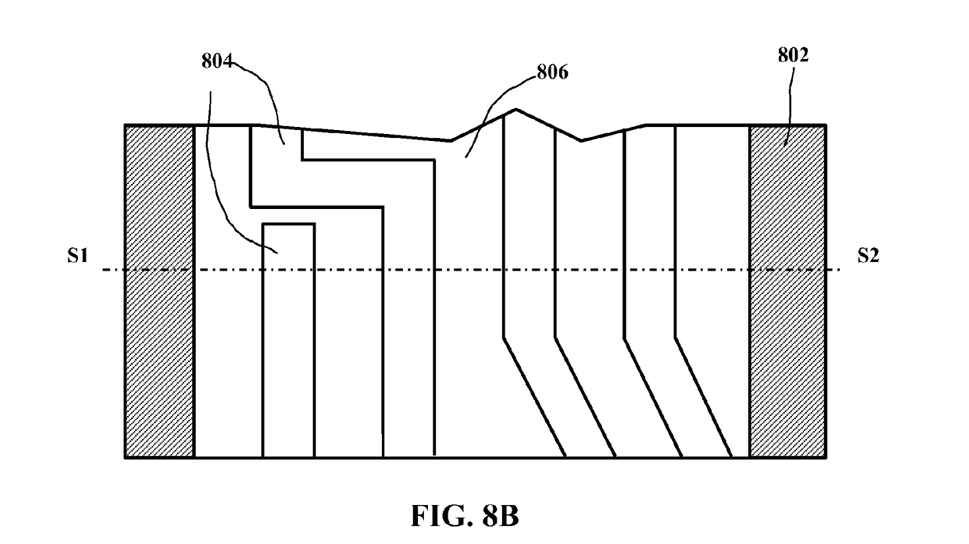

Another example of structural modification using scanning pattern of the electron beam varied as a function of depth shown on FIG. 4A is to build complex optical structures known in optical lithography as phase-shift masks (PSM). On FIG. 8A is shown an example of Alternating PSM (AltPSM) fabrication from clear quartz wafer 800 by means of etching trenches 806 for 180 degrees phase shift leaving areas 804 with 0 degress phase shift. Chrome lines 802 do not allow the light to go through. As the phase goes from positive to negative, it passes through 0. The intensity (proportional to the square of the phase) also goes through 0, making a very dark and sharp line on the wafer. Thus a resist pattern similar to mask pattern, schematically shown on FIG. 8B in a way of example, remains after development. The cross-section on FIG. 8A is made along the S1-S2 dashed line indicated. As known, the AltPSM must be accompanied by a second "trim" mask, resulting in extra cost and decreased stepper throughput. The trimming process can be done using eBACE method.

The disclosed eBACE method can be used to correct defects in devices and components with significant reduction of fabrication costs since it combines two processes simultaneously—etching and imaging. Fabrication process quality can be achieved by minimization of difference between known defects in fabricated device and ideal device. This reduction can be done by iterative etching and imaging of existing defects.

Another advantage of eBACE method is that it can be used for strain reduction or isolation by etching strain relief trenches.

Another alternative embodiment of the present invention relates to patterning of certain metals that cannot be etched by conventional techniques. Such embodiments may be employed e.g., in fabrication of integrated circuit devices that use copper for electrical interconnections. Copper is generally a better conductor than aluminum. Consequently copper metal components can be made smaller that aluminum components and will require less energy to pass electricity through them, which leads to better processor performance. Because copper does not easily form volatile compounds, copper can not be patterned by photoresist masking and etching techniques and/or by eBACE, as may be done with aluminum. Instead an additive patterning process is used. In this process, an underlying silicon oxide insulating layer is patterned with open trenches where the conductor should be. A thick coating of copper that significantly overfills the trenches is deposited on the insulator, and Chemical-Mechanical Polishing (CMP) method is used to remove the copper to the level of the top of the insulating layer. Copper sunken within the trenches of the insulating layer is not removed and becomes the patterned conductor.

Figure 9A:
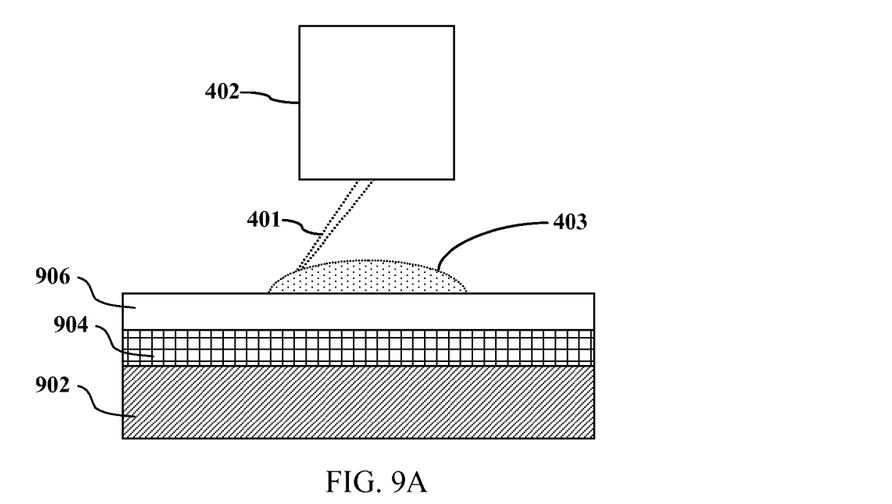
FIG. 9A-9D are schematic cross sectional views illustrating method for etching copper patterns using eBACE method combined with oxygen ion beams according to another alternative embodiment of the present invention.
Figure 9B:
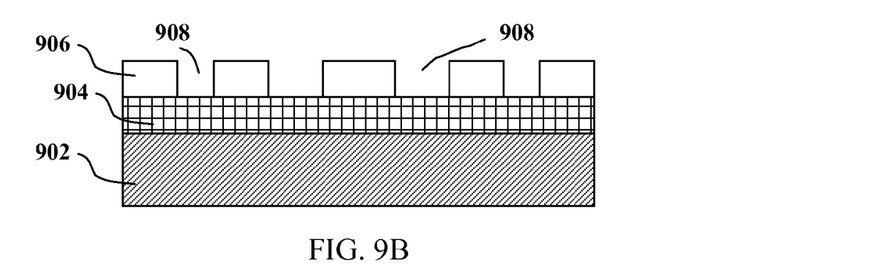
Figure 9C:
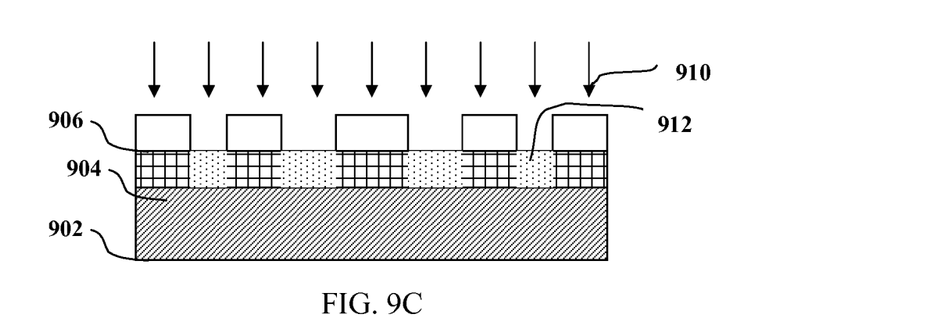

In an embodiment of the present invention the eBACE method may be combined with selective ion implantation for patterned etching of materials that are otherwise difficult to etch. The ion implantation may be performed either with or without using a mask. For example, as shown in FIG. 9A a wafer 902 may be covered by a copper layer 904 with an insulator layer 906 on the top. The insulator layer 906 can be etched by means of interaction of electron beam 401 from a beam column 402 with gas composition 403 to form trenches 908 in the insulator layer 906 using eBACE as shown in FIG. 9B. The trenches expose portions of the copper layer 904. Alternatively, the mask pattern may be formed using conventional photolithographic techniques. Once the mask is formed, exposed portions of the copper layer 904 are subjected to bombardment by energetic ions 910 to create volumes 912 of volatilizable material beneath the trenches as illustrated in FIG. 9C. For example, the energetic ions 910 may be oxygen ions. Implanting sufficient doses of oxygen ions into the copper layer 904 can form volumes 912 of copper oxide. Where a mask is used, the ion bombardment may take place over a wide area. In alternative embodiments, ions may be implanted at selected locations without using a mask. For example, a focused ion beam system may be used to directly "write" a pattern of ion implantation at selected locations on the copper layer 904. Furthermore, embodiments of the invention may be implemented using combinations of ion bombardment through a mask and direct write (e.g., focused beam) ion implantation. Alternatively, ions may be implanted using an ion diffusion top layer deposition tool.

Figure 9D:
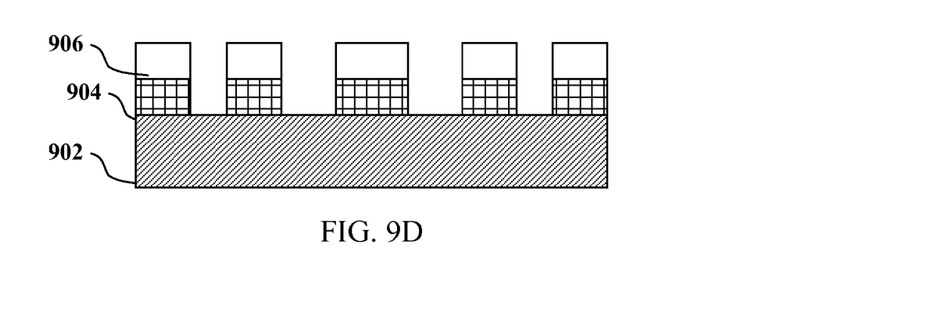

The depth of ion implantation may be controlled, e.g., by control of the ion energy. Oxygen implantation depths for energies between about 20-50 kV have been reported for implantation of oxygen ions into copper to depths of about 200 nm to about 300 nm. The copper oxide volumes 912 may be etched using eBACE method to form a desired pattern on a wafer shown on FIG. 9D. By way of example, and without limitation, a gas composition used to etch copper oxide volumes 912 may include a chlorine-based etching compound, e.g., $Cl_x$-$F_x$. The electron beam may be provided by a wide area "flood" gun, e.g., a 300-mm electron flood gun. The smoothness of the bottom of the etched structure has been determined to be largely dependent on the oxygen ion dose (e.g., in terms of the number of ions implanted per unit area). Generally, a higher dose produces a smoother bottom to the etched structure. In experiments, structures 200 nm to 300 nm deep have been formed in copper with 1 nm root mean square (rms) bottom uniformity using a combined oxygen ion implantation and eBACE technique. Experiments were performed using an oxygen ion energy of about 300 electron volts and an ion dose of about $10^{15}$ ions/$cm^2$.

It is noted that rotationally symmetric patterns may be etched using the above ion implantation and eBACE technique by rotating the target substrate about an axis during ion implantation using a focused ion beam. The ion dose may be varied as a function of radius to obtain a desired dose profile with respect to radius. In addition, ion energy may be varied with respect to radius to produce a desired etch pattern with respect to radius.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for modifying a surface of a substrate (or a portion thereof), comprising:
    implanting ions into the one or more portions of the surface to chemically convert the one or more portions to a material that is susceptible to etching due to interaction with the electron beam and gas composition;
    exposing one or more portions of the surface to a gas composition, the gas composition containing one or more gaseous components that etch the substrate upon activation by interaction with a beam of electrons;
    directing a beam of electrons (electron beam) to the one or more portions of the surface of the substrate that are exposed to the gas composition to etch the one or more portions; and modifying one or more features on the surface of the substrate by adjusting the electron beam to vary a pattern of etching of the one or more portions, wherein adjusting the electron beam includes increasing or reducing a rate of etching of selected portions of the surface of the substrate that are subjected to the electron beam relative to a rate of etching of other portions of the substrate that are subjected to the electron beam by adjusting one or more parameters of the electron beam
    wherein a dose and/or energy of the ions implanted into the one or more portions of the surface is configured to achieve a desired smoothness of a bottom of the pattern of etching of the one or more portions.

2. The method of claim 1 wherein the one or more features include one or more Fin FETs, wherein modifying the one or more features includes trimming the one or more Fin FETs.

3. The method of claim 1 wherein increasing or reducing a rate of etching includes obtaining an image of the surface of the substrate and determining from the image whether to increase or reduce the rate of etching of a given selected portion.

4. The method of claim 1, wherein modifying one or more features includes fabrication of one or more optical elements on the surface of the substrate.

5. The method of claim 4 wherein the one or more optical elements include one or more lenses, Fresnel lenses or diffraction gratings.

6. The method of claim 1 wherein modifying one or more features includes forming a strain-relieving trench on the surface of the substrate.

7. The method of claim 1 wherein the substrate is a lens, wherein modifying one or more features includes changing an optical property of the lens.

8. The method of claim 7 wherein changing of the lens includes forming one or more trenches on a surface of the lens, the one or more trenches being arranged in a pattern that produces counter-defects that compensate for optical defects in the lens.

9. The method of claim 1 wherein directing a beam of electrons to one or more portions of the surface includes rotating the substrate about an axis.

10. The method of claim 1 wherein the one or more portions of the substrate include copper.

11. The method of claim 10 wherein the ions include oxygen ions, whereby implanting the ions converts selected portions of the substrate from copper to copper oxide.

12. The method of claim 11 wherein the gas composition includes a chlorine-based compound selected to etch the copper oxide upon exposure of the copper oxide to the chlorine-based composition and the electron beam.

13. The method of claim 10, further comprising varying an energy of the ions to adjust a depth of the material that is susceptible to etching.

14. The method of claim 1, further comprising rotating the substrate about an axis while implanting the ions.

15. The method of claim 14, wherein implanting the ions includes adjusting an ion does and/or ion energy as a function of radius from the axis.

16. The method of claim 1, wherein implanting the ions into the one or more portions of the substrate includes forming a mask having one or more openings on a surface of the substrate and bombarding the one or more portions of the substrate through the one or more openings.

17. The method of claim 1, wherein implanting the ions into the one or more portions of the substrate includes bombarding the one or more portions of the substrate with a focused beam of the ions.

18. The method of claim 1 wherein adjusting the electron beam includes varying an electron beam energy, an electron beam current, a scanning pattern, a repetition rate, or a dwell time of the electron beam from an electron beam column while etching the one or more portions.

* * * * *